(12) United States Patent
Greywall

(10) Patent No.: US 6,487,001 B2
(45) Date of Patent: Nov. 26, 2002

(54) ARTICLE COMPRISING WEDGE-SHAPED ELECTRODES

(75) Inventor: Dennis S. Greywall, Whitehouse Station, NJ (US)

(73) Assignees: Agere Systems Inc., Allentown, PA (US); Lucent Technologies Inc., Murray Hill, NJ (US)

( * ) Notice: Subject to any disclaimer, the term of this patent is extended or adjusted under 35 U.S.C. 154(b) by 123 days.

(21) Appl. No.: 09/736,011

(22) Filed: Dec. 13, 2000

(65) Prior Publication Data

US 2002/0071171 A1 Jun. 13, 2002

(51) Int. Cl.$^7$ .............................................. G02B 26/00
(52) U.S. Cl. ....................... 359/292; 359/295; 359/290; 359/223; 359/230; 359/245
(58) Field of Search ................................. 359/290, 291, 359/245, 292, 295, 293, 248, 223, 224, 230; 438/97, 48, 50, 712

(56) References Cited

U.S. PATENT DOCUMENTS 6,201,631 B1 * 3/2001 Greywall .................... 359/245

* cited by examiner

*Primary Examiner*—Hung Xuan Dang
*Assistant Examiner*—Tuyen Tra

(57) ABSTRACT

An electrode for use in actuating MEMS elements. The electrode declines in height along its length from a first end thereof to second end thereof. In use, the first end of the electrode is disposed proximal to an axis of rotation or axis of bending of an overlying MEMS element. In one embodiment, the decline in height of the electrode along its length is linear such that the electrode has a wedge-shaped profile. In another embodiment, the height of the electrode declines in discrete steps such that the electrode has a stepped profile.

16 Claims, 3 Drawing Sheets

US 6,487,001 B2

ARTICLE COMPRISING WEDGE-SHAPED ELECTRODES

FIELD OF THE INVENTION

The present invention pertains to micro-electromechanical systems (MEMS) devices. More particularly, the present invention relates to improvements in electrodes for use in MEMS devices.

BACKGROUND OF THE INVENTION

MEMS devices have been used in a variety of optical applications. The prior art is replete with examples of MEMS-based optical modulators, add-drop filters, attenuators and routers.

Each optical MEMS device typically incorporates a "mirror" that is capable of altering the path of a received optical signal or simply attenuating the signal's intensity. The mirror, which is usually realized as a movable beam or plate, is configured to use either optical interference principles or simple reflection to provide the above-stated capabilities. In optical MEMS devices that rely on simple reflection, the movable beam typically comprises polysilicon or silicon that is coated with metal to provide a reflective surface. The movable beam is usually configured for movement via one of the two arrangements that are described below.

In a first arrangement 100 depicted in FIG. 1A (top view) and FIG. 1B (side view), movable, electrically conductive beam 102 is cantilevered over a cavity 104. Flat planar electrode 106 is disposed within cavity 104 beneath movable beam 102. In a second arrangement 200 depicted in FIG. 2A (top view) and FIG. 2B (side view), movable, electrically conductive beam 202 is suspended by supports 208A and 208B over cavity 204. Flat planar electrodes 206A and 206B are disposed in cavity 204 beneath movable beam 202.

As a potential difference is developed across movable beam 102 and electrode 106 of first arrangement 100, an electrostatic force is generated. The force bends movable beam 102 toward electrode 106. Similarly, as a potential difference is developed across movable beam 202 and either one of electrodes 206A or 206B, an electrostatic force is generated that draws the movable beam towards the actuated electrode. Supports 208A and 208B twist to allow movable beam 202 to move in such fashion. As beam 102 and beam 202 move, the path followed by an optical signal that is reflected therefrom is altered.

Both arrangement 100 and arrangement 200 suffer from a significant shortcoming. In particular, the actuation voltage necessary to achieve the required amount of mirror rotation (for sufficiently altering the path of an optical signal) is large (i.e., about 150 volts for a typical design). There is a need, therefore, to reduce the actuation voltage requirements of electrostatically-driven, MEMS-based, movable mirrors.

SUMMARY OF THE INVENTION

Some embodiments of the present invention provide an electrode that is capable of reducing the actuation voltage of MEMS-based mirrors.

An electrode in accordance with the present teachings declines in height along its length from a first end thereof to second end thereof. In one embodiment, the decline in height of the electrode along its length is regular or linear such that the electrode has a wedge-shaped profile. In another embodiment, the height of the electrode declines in discrete steps such that the electrode has a stepped profile.

In use, the electrode is disposed beneath a MEMS mirror (e.g., a beam, etc.). The first end of the electrode is disposed proximal to an axis of rotation or axis of bending of the mirror. Due to the geometry of the present electrode, the gap between the MEMS mirror and the surface of the electrode can be smaller than the gap between a MEMS mirror and the flat-planar electrodes in the prior art. Consequently, in such embodiments, the voltage requirement for a MEMS mirror that is actuated by the present electrode is reduced relative to voltage requirement for a MEMS mirror that is actuated by electrodes of the prior art.

DETAILED DESCRIPTION

For convenience, the terms "beam," "plate," "member" and "element" are used interchangeably in this Specification. That is, use of the term "beam" in the Description or Claims, for example, is not meant to exclude other mechanical members that, strictly speaking, are not beams.

Structure and Operation

Figure 1B:
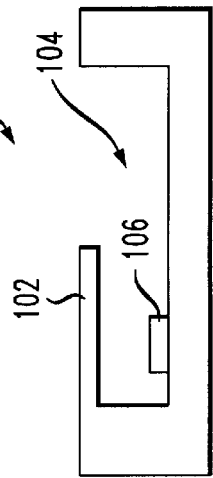
FIG. 1B depicts a side view of an arrangement in the prior art comprising a MEMS mirror cantilevered over a flat planar electrode.
Figure 2B:
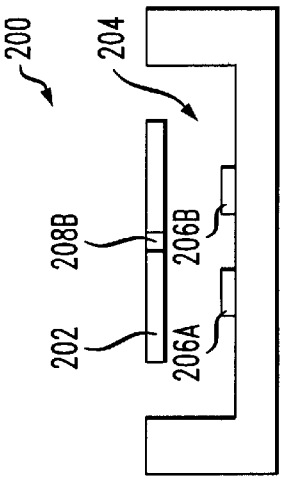
FIG. 2B depicts a side view of an arrangement in the prior art comprising a MEMS mirror supported above flat planar electrodes by torsional members.
Figure 1A:
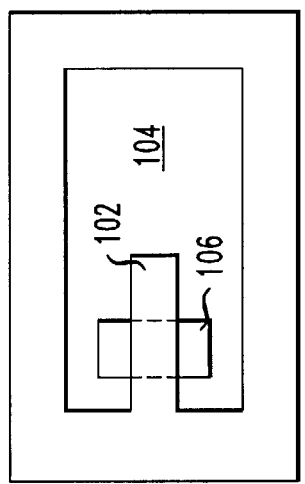
FIG. 1A depicts a top view of an arrangement in the prior art comprising a MEMS mirror cantilevered over a flat planar electrode.
Figure 2A:
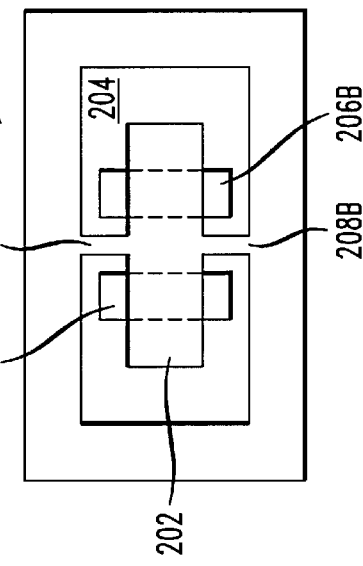
FIG. 2A depicts a top view of an arrangement in the prior art comprising a MEMS mirror supported above flat planar electrodes by torsional members.
Figure 3:
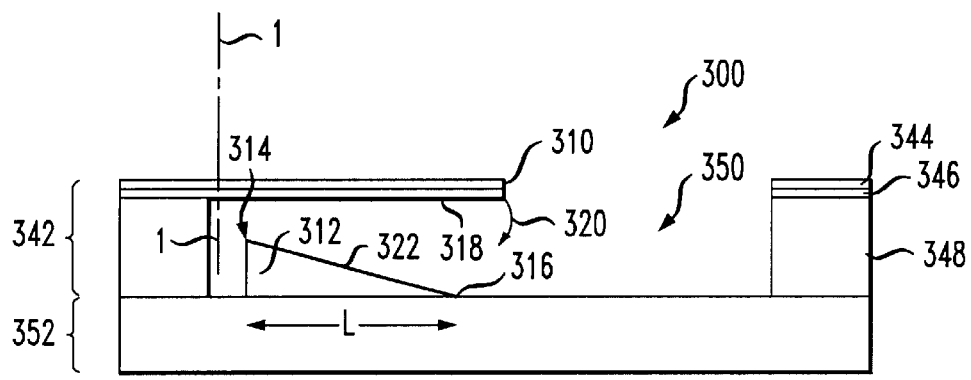
FIG. 3 depicts a side view of an arrangement comprising a MEMS mirror cantilevered over a wedge-shaped electrode in accordance with the present teachings.
Figure 4:
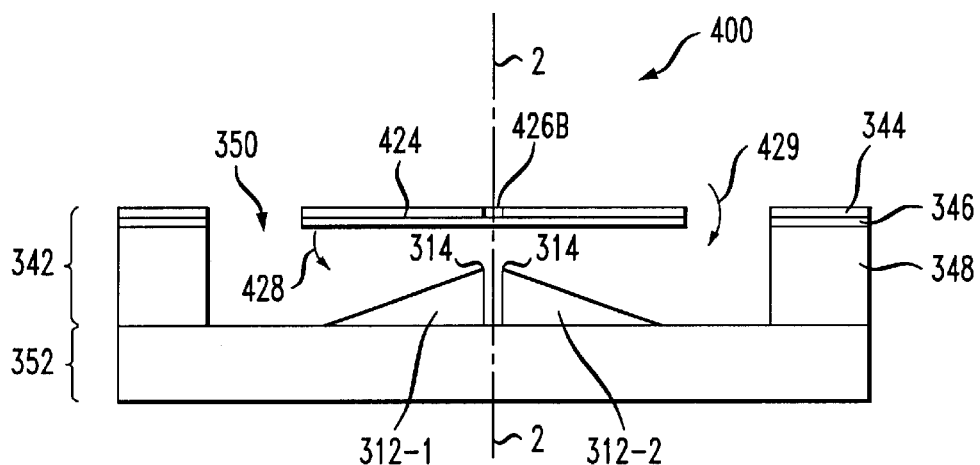
FIG. 4 depicts a side view of an arrangement comprising a MEMS mirror supported for torsional movement over wedge-shaped electrodes in accordance with the present teachings.

FIGS. 3 and 4 depict improved micro-mechanical devices in accordance with the present teachings. FIG. 3 depicts device 300 that has the same configuration as prior art device 100. That is, device 300 comprises a beam 310 that is cantilevered over an electrode 312. FIG. 4 depicts device 400 that has the same configuration as prior art device 200. That is, device 400 comprises a beam 424 that is movably supported over two electrodes 312-1 and 312-2 by two supports. Only one of the supports, support 426B, is shown in the cross sectional view depicted in FIG. 4.

Unlike prior art arrangements in which flat planar electrodes (e.g., electrodes 106, 206A, 206B) are used, devices 300 and 400 incorporate electrode 312, which, in accordance with the present teachings, declines in height, as measured at surface 322, along its length L from first end 314 to second end 316.

First (higher) end 314 of electrode 312 is disposed proximal (relative to second lower end 316) to an axis of rotation or axis of bending (hereinafter collectively "axis of rotation") of the overlying movable beam. For example, in device 300, first end 314 of electrode 312 is disposed proximal to axis of rotation 1-1 of beam 310. In device 400, first end 314 of electrode 312-1 and first end 314 of electrode 312-2 are disposed proximal to, and on opposite sides of, axis of rotation 2-2 of beam 424.

In the embodiments depicted in FIGS. 3 and 4, electrode 312 has a wedge-shaped profile. That is, the decline in the height of surface 322 is regular or linear along its length L. In other embodiments, however, the decline in the height of surface 322 with length L is not linear.

Figure 5:
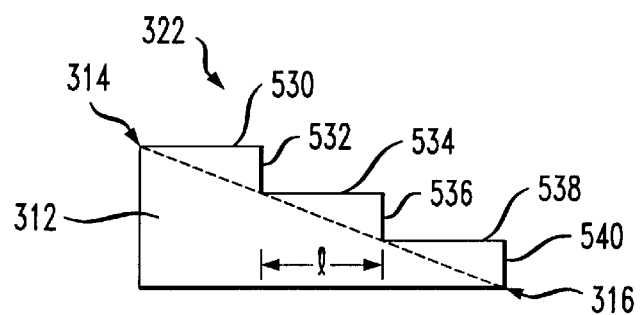
FIG. 5 depicts a side view of a stepped electrode that, in one embodiment, is used in place of the wedge-shaped electrode of FIGS. 3 and 4, in accordance with the present teachings.

For example, FIG. 5 depicts an embodiment wherein electrode 312 has a stepped profile. That is, the height of surface 322 declines, from first end 314 to second end 316, in a series of discrete steps 532, 536 and 540. In the embodiment depicted in FIG. 5, the decline occurs at three substantially equal intervals along length L such that plateaus 530, 534 and 538 of substantially equal length I result. In another embodiment (not depicted), the decline in the height of surface 322 occurs in fewer (i.e., two) steps. In still further embodiments (not depicted), the decline in the height of surface 322 occurs in more than three steps. It will be appreciated that as the number of steps increases across length L, the profile of surface 322 approaches the wedge shape depicted in FIG. 3.

Movable beam 310 and movable beam 424 are electrically conductive. As a potential difference between electrode 312 and the movable beam is increased, the beam is drawn toward electrode 312. In particular, in arrangement 300, as a potential difference is increased, beam 310 moves along path 320 toward electrode 312. Similarly, in arrangement 400, beam 424 moves toward either electrode 312-1 along path 428 or electrode 312-2 along path 429 depending upon which of those electrodes is energized. The movement of the beam toward electrode 312 results from an electrostatic force that is generated therebetween due to the applied potential difference.

By comparing FIG. 3 to FIG. 1B and FIG. 4 to FIG. 2B, it becomes apparent that, for a desired amount of downward movement of an overlying beam, the gap between first end 314 of electrode 312 and the overlying beam (i.e., beam 310 or beam 424) can be smaller than the gap between the beam and flat-planar electrodes of the prior art. In particular, in prior art arrangement 100, as the surface of electrode 106 is raised toward beam 102, the amount that beam 102 can be tilted (without contacting the electrode) is reduced. Furthermore, as it moves downwardly, the beam (i e., beam 310 and beam 424) assumes an increasingly declined attitude that places it in quasi-parallel relationship with the sloped/stepped surface of electrode 312. In this manner, when actuated, the gap between electrode 312 and an overlying beam approaches the gap between the beam and first end 314 of electrode 312 before actuation.

So, for an otherwise identical arrangement (i.e., identical beam length, identical beam thickness, etc.) and an identical amount of beam tilt, a smaller gap is obtainable between the electrode and the beam when the present electrode is used. And of course, as the gap decreases in size, the actuation voltage requirement decreases.

Consequently, by incorporating the present electrode into micro-mechanical devices, such as device 300 and device 400, the amount of voltage that is required to deflect a beam a given distance is reduced in comparison with devices that incorporate the flat planar electrodes of the prior art. In fact, it can be shown that using the present electrode, the voltage requirement can be reduced by a factor of 0.6 relative to the prior art.

Fabrication

Micro-mechanical devices, such as device 300 and device 400, are advantageously fabricated by forming the movable beam in a first substrate or wafer, forming the electrode(s) on a second substrate or wafer, and then joining the substrates or wafers. The first substrate advantageously comprises three layers, as in illustrative devices 300 and 400.

With reference to FIGS. 3 and 4, the movable beam (e.g., beam 310 and beam 424) is fabricated from substrate 342 having three layers, including a top, relatively thin layer (i.e., layer 344), a bottom, relatively thick layer (i.e., layer 348), and an intermediate, relatively thin layer (i.e. layer 346) that is sandwiched between the top and bottom layers.

Bottom, relatively thick layer 348 is used to define a cavity 350 that separates the movable beam from the electrode substrate 352. To do so, bottom layer 348 is appropriately patterned and then etched (e.g., via deep reactive ion etching, laser milling, etc.) "up" to intermediate layer 346. Intermediate layer 346 serves as an etch/milling stop between layers 344 and 348. While it is possible to fabricate micro-mechanical devices without the use of an etch-stop, it is substantially more difficult to control the extent of etching/milling steps without it.

Top, relatively thin layer 344 is used to form the "mechanical" portions of the device (i.e., the movable beams and supports of devices 300 and 400). More particularly, top layer 344 is appropriately patterned and etched (e.g., via reactive ion etching, etc.) "down" to intermediate layer 346. After defining the beams, supports and cavity, the beams and supports are "released" by removing intermediate layer 346 in appropriate areas (i.e., areas in which top layer 344 does not overlie intermediate layer 346).

Top layer 344 and bottom layer 348 advantageously comprise semiconductor material, such as, without limitation, silicon or polysilicon. At least a portion of top layer 344 is doped, as necessary, to render a beam (e.g., beams 310 and 424) electrically conductive. Since intermediate layer 346 functions as a "stop-etch" layer, it must therefore comprise a material that resists being etched by processes that will readily etch the top and bottom layers. In some embodiments, layer 346 comprises an oxidized semiconductor material, such as, without limitation, silicon oxide.

The thickness of the various layers comprising substrate 342 can vary as a function of application specifics. For devices 300 and 400, and for a variety of other devices, the nominal thickness of top layer 344 and intermediate layer 346 is in the range of about 1 to 2 microns. Bottom layer 348 has a thickness in the range of about 300 to 700 microns.

In one embodiment, substrate 342 comprises a silicon-on-insulator ("SOI") wafer. Such wafers typically comprise a bottom bulk or "thick" silicon layer (about 500 to 700 microns in thickness as a function of wafer diameter), an oxide layer (about 0.2 to 3 microns in thickness) disposed thereon, and a "thin" silicon layer (about 0.1 to 10 microns) that is disposed on top of the oxide layer. The arrangement and thickness of such layers are consistent with the nominal ranges for layer thickness provided above. SOI wafers are commercially available from SOITEC USA, Inc. of Peabody, Mass. and others.

Electrode(s) 312 are formed on/in substrate 352 using well known photolithographic or surface machining techniques. To impart a wedge-shaped profile to an electrode, radiation (e.g., UV light, etc.) is applied to a material that is being patterned/etched (e.g., a layer of photoresist, electrode material, etc.) such that a linear energy variation results at the surface of the material.

To achieve the energy variation discussed above, the halftone, de-focused techniques described by D. R. Purdy, "Fabrication of Complex Micro-Optic Components Using Halftone Transmission Masks to Photosculpt Positive Resist," EOS Top. Mtg. Dig. S., Vol. 2 (1993) and Hisanaga et al., "Fabrication of 3-Dimensionally Shaped Si Diaphragm Dynamic Focusing Mirror," Proc. IEEE Micro. Electro. Mech. Sys. at 30–35 (1993) may suitably be used. These techniques involve developing a photomask with a predetermined variation in gray scale levels. When photoresist is exposed through such a mask, the variation in energy transmission will result in a complementary variation in the depth to which the resist is exposed. Focus is adjusted to introduce a degree of blur so that the digitized nature of the photomask will not be reproduced, resulting in a smooth surface at the photoresist.

Another approach is to use a photomask with linearly graded regions. The linearly graded regions may be formed by a thin film of chromium or iron oxide of appropriately increasing or decreasing particle density. In one embodiment, a thin film of inconel is used to create a photomask according to a process developed by Oxford Computer Inc., in Oxford, Conn. Film thickness is varied to achieve a linear variation in the energy incident upon, for example, photoresist.

In a third method for providing a tapered, wedge-shaped profile, a photomask comprising a slit of small width is positioned over the substrate. The mask or substrate is held by a motorized micro-positioner. As incident radiation is directed, for example, at photoresist, the slit is scanned along the substrate, or vice versa, over the desired length of the electrode. The rate at which the scanning occurs is varied to change the amount of energy incident upon any particular section of photoresist. The amount of photoresist remaining after exposure and subsequent development is directly dependent upon the amount of energy to which it was exposed. Thus, as energy is varied linearly over the desired length, a wedge of photoresist results.

A fourth method for obtaining a tapered profile is E-beam lithography, which involves the use of a scanning electron beam. In this method, a suitably programmed E-beam writer is scanned along the intended width of the electrode. A number of scanning passes are made across the width of the region. After each pass, the beam is indexed along the intended length of the electrode. Thus, each scan is performed at a slight lengthwise displacement from the previous scan. In this manner, the full area of the intended electrode is sequentially exposed. As the E-beam is indexed along the length of the region, the energy of the beam is varied as required to alter the exposure depth to provide the desired taper.

After electrode(s) 312 are fabricated on/in substrate 352, substrate 342 and substrate 352 are attached so that the highest point of electrode 312 (i.e., first end 314) is proximal to the axis of rotation of the overlying movable beam.

An electrode with a stepped profile, as depicted in FIG. 5, is readily fabricated with an appropriate mask or successive patterning steps in known fashion.

Illustrative Application—Optical Cross Connect

Figure 6:
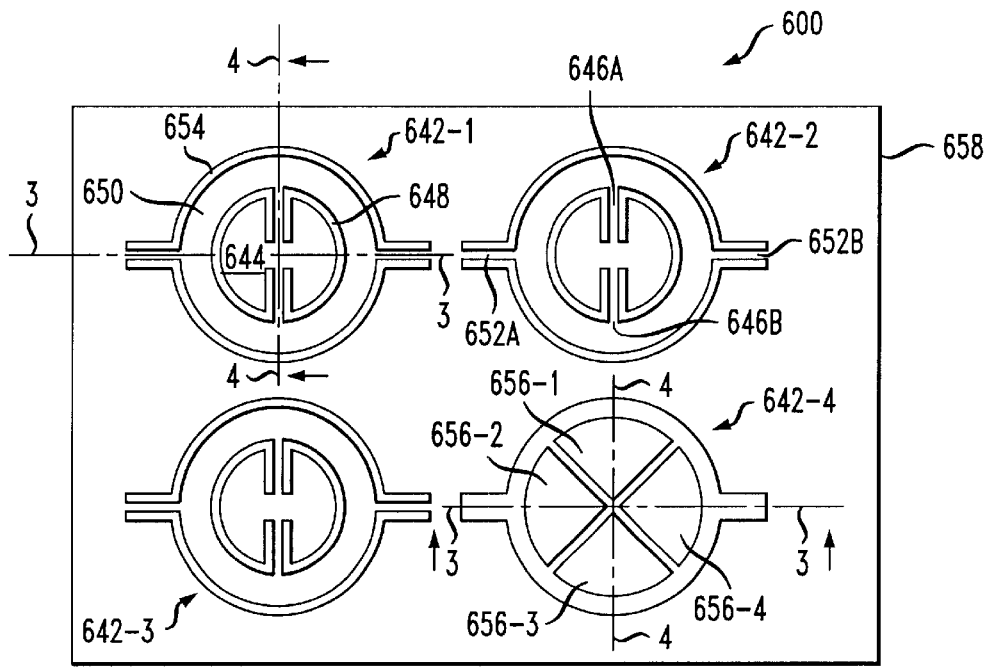
FIG. 6 depicts a top view of a portion of a cross connect for routing optical signals, the cross connect comprising an array of gimbal mirrors.
Figure 7:
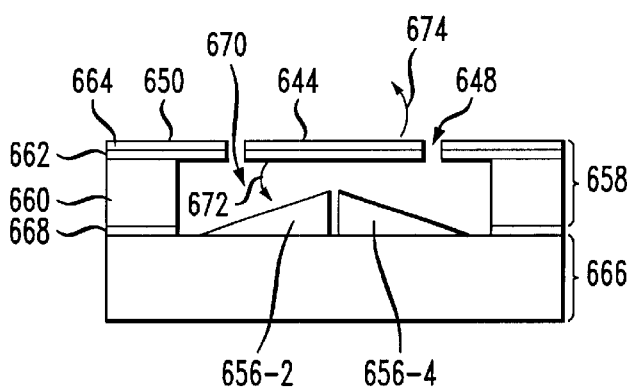
FIG. 7 depicts a cross-sectional side view (along axis 3—3 of FIG. 6 in the direction indicated) of a gimbal mirror, including underlying electrodes.
Figure 8:
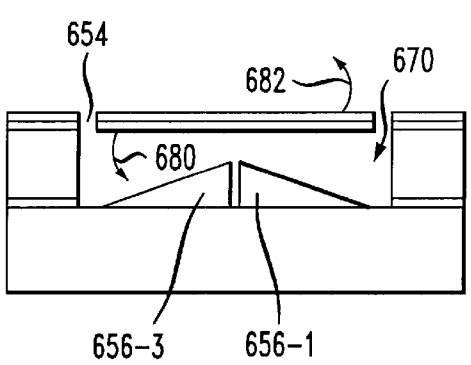
FIG. 8 depicts a cross-sectional side view (along axis 4—4 of FIG. 6 in the direction indicated) of a gimbal mirror, including underlying electrodes.

FIGS. 6–8 depict the use of the present electrode in conjunction with an optical cross connect having a plurality of "gimbal" mirrors. Such a cross-connect has been described in U.S. pat. app. Nos. 09/415,283 and 09/559,216, both of which are incorporated herein by reference.

FIG. 6 depicts a top view of optical cross connect 600 that has four mirrors 642-1, 642-2, 642-3 and 642-4. For pedagogical purposes, the mechanical or movable elements of mirror 642-4 are not depicted; rather, four electrodes 656-1 through 656-4 that underlie those elements are shown.

Mirrors 642-1, 642-2, 642-3 and 642-4 are arranged in a n×m (i.e., 2×2) array. In a typical application, the optical cross contains a greater number of mirrors; however, for the sake of clarity, only four are depicted in FIG. 6.

Each mirror 642-i comprises optical element 644 and gimbal 650 that are separated by gap 648 and are disposed in concentric relation to one another. Optical element 644 is movably attached to gimbal 650 by supports 646A and 646B and is capable of rotating about axis 4-4. In one embodiment, optical element 644 functions as a mirror that, in operation of cross connect 600, receives an optical signal (not depicted) and reflects it.

Gimbal 650 is movably attached to a surrounding substrate 658 by supports 652A and 652B, as well as being attached, as described above, to optical element 644. Gimbal 650 is separated from the surrounding substrate by gap 654. Gimbal 650 advantageously provides a second degree of freedom to optical element 644. In particular, as described below in more detail, gimbal 650 allows optical element 644 to move in second direction (i.e., about axis 3-3).

Electrodes 656-1, 656-2, 656-3 and 656-4 are disposed in cavity 670 beneath optical element 644 and gimbal 650. The electrodes decrease in height from one end to the other, in the manner previously described. Furthermore, the electrodes are positioned such that the highest point of each electrode is proximal to the point of intersection of axis 3-3 with axis 4-4. In other words, the four electrodes are arranged, collectively, in the shape of a cone with the apex of the cone aligned with the intersection of axis 3-3 with axis 4-4.

The electrodes are operable to urge the gimbal and/or optical element to movement. In particular, as a potential difference is developed across one or more of the electrodes 656-1 through 656-4 and optical element 644 or gimbal 650, an electrostatic force of attraction is developed therebetween causing the movably supported gimbal and/or optical element to move toward the energized electrode(s).

For example, with reference to FIG. 7, if electrode 656-2 is energized, then the overlying portion of optical element 644 (see, e.g., FIG. 6) moves downwardly toward electrode 656-2 rotating about axis 4-4 in the direction 672. As that portion of optical element 644 moves toward electrode 656-2, the other portion of optical element 644 (i.e., the portion on the "right" side of axis 4-4; see mirror 642-1 of FIG. 6) moves upwardly, rotating about axis 4-4 in the direction 674 in seesaw-like fashion. If electrode 656-4 is energized, optical element 644 rotates about axis 4-4 in the opposite direction (i.e., counterclockwise).

If, on the other hand, electrode 656-3 is energized (see, e.g., FIG. 8), then the overlying portion of gimbal 650 (see, e.g., FIG. 6) moves downwardly toward electrode 656-3 about axis 3-3 in the direction 680. As that portion of gimbal 650 moves toward electrode 656-3, the other portion of gimbal 650 moves upwardly, rotating about axis 3-3 in the direction 682. And, of course, if electrode 656-1 is energized, gimbal 650 rotates in the opposite direction about axis 3-3 (i.e., counterclockwise).

In summary, optical element 644 rotates with gimbal 650 about axis 3-3. Moreover, optical element 644 is operable to move independently of gimbal 650 about axis 4-4.

In the embodiment depicted in FIGS. 6–8, the electrodes are depicted as being disposed under both optical element 644 and gimbal 650. In other embodiments, the electrodes do not extend beneath gimbal 650. In such embodiments, rotation about axis 3-3 is caused by the applying a voltage difference across electrode 656-1 or 656-2 and optical element 644. The resulting force of attraction is sufficient to rotate gimbal 650 and optical element 644 along with it.

Cross connect 600 is advantageously fabricated from two substrates, such as substrate 658 and 666 (see FIG. 7). In the illustrative embodiment, substrate 658, which comprises three layers 664, 662 and 660, is used to fabricate mechanical elements (i.e., optical element 644, gimbal 650 and the supports) and create cavity 670. Electrodes 656-1, 656-2, 656-3 and 656-4 are disposed on, or formed from, substrate 666. The two substrates are separated from one another by an electrically insulating material 668, such as an oxide.

It is to be understood that the above-described embodiments are merely illustrative of the invention and that many variations may be devised by those skilled in the art without departing from the scope of the invention and from the principles disclosed herein. It is therefore intended that such variations be included within the scope of the following claims and their equivalents.

I claim:

1. An article comprising:
   an electrode that declines in height along its length from a first end thereof to a second end thereof; and
   an electrically conductive member that is movably supported above said electrode; wherein:
   said member is operable to rotate about a first axis of rotation; and
   relative to the second end of said electrode, the first end of said electrode is disposed proximal to said first axis of rotation.

2. The article of claim 1 wherein the decline in height of said electrode is linear along its length.

3. The article of claim 1 wherein the height of said electrode decreases step-wise along its length.

4. The article of claim 1 wherein a portion of an upper surface of said member is reflective.

5. The article of claim 4 wherein a metal is disposed on said portion of the upper surface of said member.

6. The article of claim 1 wherein said article comprises a first substrate having a first layer of semiconductor material and a second layer of semiconductor material separated by a layer of an oxidized semiconductor material,
   and further wherein said member comprises a portion of said first layer of semiconductor material and a portion of said layer of oxidized semiconductor material.

7. The article of claim 6 wherein said article comprises a second substrate bonded to said first substrate, said second substrate including said electrode.

8. The article of claim 7 wherein said member is cantilevered over said electrode, wherein said second layer of semiconductor material supports said member.

9. The article of claim 7 wherein:
   said member is supported by a first support arm and a second support arm;
   said first and second support arms are operable to twist; and
   said first axis of rotation is aligned with said first and second support arms.

10. The article of claim 9 wherein said electrode is a first electrode and further comprising a second electrode that declines in height along its length from a first end thereof to a second end thereof, wherein:
    relative to the second end of said second electrode, the first end of said second electrode is disposed proximal to said first axis of rotation of said member; and
    said first and second electrode are disposed on opposed sides of said first axis of rotation.

11. The article of claim 9 wherein said member comprises concentric outer and inner parts, and further wherein:
    said outer part is a gimbal and said inner part is an optical element;
    said gimbal is attached to said first and second support arms and is operable to rotate about said first axis of rotation;
    a third and a fourth support arm attach said gimbal to said optical element; and
    said optical element is operable to rotate independently of said gimbal about a second axis of rotation that is aligned with said third and fourth support arms.

12. The article of claim 11 wherein said first axis of rotation is orthogonal to said second axis of rotation.

13. The article of claim 12 comprising a third electrode and a fourth electrode, wherein:
    said third and fourth electrodes each decline in height along their length from a first end thereof to a second end thereof;
    said first and second electrode are disposed on opposed sides of said first axis of rotation;
    said third and fourth electrodes are disposed on opposed sides of said second axis of rotation.

14. The article of claim 13 wherein:
    relative to the second end of said second electrode, the first end of said second electrode is disposed proximal to said first axis of rotation;
    relative to the second end of said third electrode, the first end of said third electrode is disposed proximal to said second axis of rotation; and
    relative to the second end of said fourth electrode, the first end of said fourth electrode is disposed proximal to said second axis of rotation.

15. The article of claim 14 wherein, under the action of applied voltage, said first and second electrodes are individually operable to rotate said gimbal about said first axis of rotation.

16. The article of claim 14 wherein, under the action of applied voltage, said third and fourth electrodes are individually operable to rotate said optical element about said second axis of rotation.

* * * * *